(12) United States Patent
Shih et al.

(10) Patent No.: US 6,716,767 B2
(45) Date of Patent: Apr. 6, 2004

(54) CONTACT PLANARIZATION MATERIALS THAT GENERATE NO VOLATILE BYPRODUCTS OR RESIDUE DURING CURING

(75) Inventors: Wu-Sheng Shih, Rolla, MO (US); James E. Lamb, III, Rolla, MO (US); Mark Daffron, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 54 days.

(21) Appl. No.: 10/282,542

(22) Filed: Oct. 28, 2002

(65) Prior Publication Data

US 2003/0129542 A1 Jul. 10, 2003

Related U.S. Application Data

(60) Provisional application No. 60/335,811, filed on Oct. 31, 2001.

(51) Int. Cl.$^7$ .............................................. H01L 21/31
(52) U.S. Cl. ...................... 438/760; 438/780; 438/781; 430/311; 430/330
(58) Field of Search ................... 838/760, 780, 838/781; 430/311, 330

(56) References Cited

U.S. PATENT DOCUMENTS

| | | | |
|---|---|---|---|
| 4,515,828 A | * | 5/1985 | Economy et al. |
| 5,605,867 A | * | 2/1997 | Sato et al. |
| 6,044,851 A | * | 4/2000 | Grieger et al. ............. 438/780 |
| 6,048,799 A | | 4/2000 | Prybyla |
| 6,391,798 B1 | | 5/2002 | DeFelice et al. |
| 6,407,006 B1 | | 6/2002 | Levert et al. |
| 6,610,593 B2 | * | 8/2003 | Kohl et al. ................. 438/760 |

* cited by examiner

Primary Examiner—Alexander Ghyka
(74) Attorney, Agent, or Firm—Hovey Williams LLP

(57) ABSTRACT

The present invention is directed towards planarization materials that produce little or no volatile byproducts during the hardening process when used in contact planarization processes. The materials can be hardened by photo-irradiation or by heat during the planarization process, and they include one or more types of monomers, oligomers, or mixtures thereof, an optional cross-linker, and an optional organic reactive solvents. The solvent, if used, is chemically reacted with the monomers or oligomers and thus becomes part of the polymer matrix during the curing process. These materials can be used for damascene, dual damascene, bi-layer, and multi-layer applications, microelectromechanical system (MEMS), packaging, optical devices, photonics, optoelectronics, microelectronics, and sensor devices fabrication.

31 Claims, 1 Drawing Sheet

CONTACT PLANARIZATION MATERIALS THAT GENERATE NO VOLATILE BYPRODUCTS OR RESIDUE DURING CURING

RELATED APPLICATIONS

This application claims the priority benefit of a provisional application entitled CONTACT PLANARIZATION MATERIALS FREE OF VOLATILE RESIDUES, Serial No. 60/335,811, filed Oct. 31, 2001, incorporated by reference herein.

FEDERALLY SPONSORED RESEARCH/ DEVELOPMENT PROGRAM

This invention was made with government support under ATP #70NANB1H3019 awarded by the National Institute of Standards and Technology (NIST). The United States government has certain rights in the invention.

BACKGROUND OF THE INVENTION

1. Field of the Invention

The present invention is broadly directed towards thermoplastics, thermal and photo-curable materials used for manufacturing microelectronic, optoelectronic, optical, microelectromechanical system (MEMS), and sensor devices using contact planarization technology. The materials produce essentially no residual volatile components upon curing.

2. Description of the Prior Art

Advanced integrated circuit (IC) designs are highly dependent upon increasingly complex device-layering techniques to produce semiconductor devices that are more powerful, have lower profiles, and require less energy to operate. This requires more circuits with much finer structures to be integrated into a chip by constructing multiple layers of interconnects and dielectrics on a semiconductor substrate in an appropriate sequence. To construct an IC, many layers containing ultra-fine structures must be patterned onto a semiconductor surface. Materials must be deposited and removed from the surface to construct such ultra-fine structures. Currently, photolithography is the predominant technique used to pattern these ultra-fine structures.

Photolithography involves depositing a photosensitive material, known as a photoresist, onto a semiconductor substrate surface. An optical transparent object (known as a photomask or reticle) having pre-defined images of the structures to be built on a semiconductor surface is placed above the photoresist-coated substrate. An appropriate wavelength of light is illuminated through the optical object. The light either decomposes or cures the exposed area of the photoresist, depending upon the nature of the photoresist and the process. The semiconductor surface is developed to produce the patterned image on the substrate surface, and the device is ready for subsequent processing.

The conditions required to successfully carry out the photolithography process are well known to those skilled in this art. For example, it is important that the photoresist be applied in a specific, uniform thickness to meet depth-of-focus requirements for the photolithography process. Thickness uniformity is a concern not only during the photolithography process, but also for the deposition of other materials onto a substrate surface during semiconductor device fabrication. For instance, if an interlayer dielectric is applied with a non-uniform thickness, the process to open vias will fail to etch completely to the bottom of the layer in the thicker dielectric areas.

Materials can be applied with good thickness uniformity if the surface to be coated is entirely planar. However, if the surface is not planar (i.e., if it has topographic features) materials often do not coat with a uniform thickness, and this can greatly affect the final yield or performance of the device. A coating deposited on top of a topographic surface tends to contour to the topography of the underlying surface, thus producing a non-planar surface.

The multi-layer structure of an IC is made by fabricating one layer on top of another. The first layer of the structure is built on a planar semiconductor surface. As a result, a topographic surface is introduced onto the semiconductor substrate surface. The second layer is built on top of the topographic surface of the first structural layer. As more layers are built on the substrate, the severity of the surface topography increases. The non-planar surface is no longer suitable for constructing the next structural layer. Therefore, the topographic surface needs to be planarized, or flattened, prior to the construction of the next layer. To planarize the topographic surface, techniques such as plasma etch-back, chemical mechanical polishing (CMP), and contact planarization techniques are typically used.

The plasma etch-back techniques involve the deposition of a thick film to smooth the underlying topographic surface to some extent. A better surface planarity can be achieved with a much thicker film. However, a longer plasma etch time is needed to etch thicker films. The deposited film must have a closely matched plasma etch rate to that of the underlying topographic layer material under specific etch parameters. Subsequently, the thick film is etched in a plasma etcher to the underneath topographic layer to improve the surface planarity.

The CMP technique utilizes a slurry solution to mechanically polish the surface against a pad with the assistance of chemical reactions that occur between the substrate material and the slurry solution. A slurry solution containing abrasive particles and certain chemicals is dispensed onto the pad surface. The topographic substrate surface is pressed against the pad. The substrate is then polished with a circular motion against the pad to remove the topography of the surface. CMP is currently used in IC fabrication. The specific requirements and processing conditions for certain materials that need to be planarized are known to those skilled in the art.

Contact planarization provides an alternative to plasma etch-back and CMP techniques to planarize topographic surfaces. The topographic surface is first deposited with a flowable planarization material. Subsequently, the surface is pressed against an optical flat surface, which allows the material to flow around the topographic structures under certain conditions. The material is then hardened either by photo-irradiation or heat to transfer the planarity of the optical flat surface onto the planarized material surface. The planarized material surface is then released from the optical flat object surface. To facilitate the separation, the optical flat object surface can be treated to lower its surface energy. This can be achieved by depositing a thin film of low surface energy material, such as a fluoropolymer or a fluorinated compound, onto the optical flat object surface. Another approach is to put a low surface energy material with comparable surface planarity, such as a disk or film, between the planarization material and optical flat object surface. Examples of low surface energy materials are materials sold under the name Teflon®, fluorocarbon polymers, or the like.

The planarized material surface is then plasma etched to the underlying topographic layer, the planarity of the optical flat surface is transferred to the underneath topographic layer, and the topographic surface is then planarized. One requirement of the planarized material is that it needs to possess a plasma etch ratio of approximately 1 in relation to that of the underlying topographic layer material.

Currently materials used for contact planarization and similar technologies contain volatile organic solvents that can remain in the cured films and cause bubble formation in the film during the hardening process. These bubbles form voids and are permanently trapped in the films upon hardening. If the bubbles are formed at the interface of the planarization material and optical flat surface, a rough surface results. In addition, trapped bubbles will deteriorate the integrity of the films as well as their properties. To prevent bubble formation, additional processes and conditions such as pre-bake or post-bake techniques, an elevated processing temperature, a vacuum processing environment, or combinations of these are needed to remove residual solvent from the films prior to the hardening process. The removal of residual solvent can cause film shrinkage. This shrinkage introduces undesirable topography at the surface because of the variation in planarized material thickness across the substrate surface. The film shrinkage is more severe over the underlying recessed areas where a thicker planarization material is deposited. Therefore, the planarity of the surface is reduced.

As described above, the contact planarization process relies on an optical flat surface to make contact with the material surface to be planarized, and the planarization material is confined and planarized to flow between two surfaces. Both the optical flat surface and the planarizing surface are not permeable to volatile vapor. If the planarization materials contain a volatile and non-reactive solvent or produce volatile byproducts during the planarization process, the volatile materials will be trapped between the two surfaces. The residual solvent will be vaporized when the planarization material is being hardened during the planarization process. This vaporization is caused by the heat generated during photo irradiation (if photo-hardening planarization materials were used), or by heat applied to the thermal-hardening planarization material during hardening. During contact planarization, the planarized material surface goes through a plasma etch process to transfer the planarity of the planarized surface to the underlying topographic layer. The residual solvent will be released during the plasma etch process, which in turn changes the plasma chemistry in the etch chamber. Consequently, the plasma etch rate and etch rate ratio are changed, which results in an inferior surface planarity of the etched surface. If the residual solvent were not homogeneously dispersed in the planarized material and even if the residual solvent is removed after the planarization process, undesirable voids will form in the planarized materials or at the interface. If the solvent vapor is trapped at the interface of the planarization material and the optical flat surface, these voids will cause a rough surface that deteriorates the planarity of the planarized material surface. If the solvent is trapped within the planarized material, the voids will cause an inconsistent material density throughout the thickness of the material, which is undesirable. More importantly, the plasma etch rate will be much faster in regions containing more numerous and larger voids than in the regions containing fewer voids. The result is a non-uniform plasma etch rate with an inferior etched surface planarity. Furthermore, these voids are most likely to be trapped in small gaps such as trenches, vias, and holes that are most critical for device fabrication.

As an alternative, a CMP process can transfer the planarized surface planarity to the underlying layer if a matched CMP removal rate between the planarized material and the underlying material can be achieved. A consistent and uniform material density is required to have a consistent and uniform CMP removal rate while polishing the material. The appearance of voids in the material has a negative impact on achieving a consistent and uniform CMP removal rate if the void size is not the same and distributed homogeneously throughout the material. Therefore, a consistent, uniform density, and void-free planarized film is required to ensure a consistent and uniform CMP removal rate within the planarized material, in order to achieve a matched removal rate while polishing the planarized material and the underlying material simultaneously.

In general, polymerization processes can be categorized into condensation polymerization and addition polymerization (Stevens, Malcolm P., *Polymer Chemistry: An Introduction*, Chapter 1, Oxford University Press, 1990, incorporated by reference herein). A polymer formed through a condensation polymerization process contains fewer atoms in its repeat unit than those in its monomer because of the generation of byproducts during the polymerization process. A polymer formed through an addition polymerization process has the same number of atoms as the monomer in its repeat unit. Some polymers can be synthesized by either condensation or addition polymerization process depending upon the choices of the polymerization starting materials. The polymerization processes may require the addition of polymerization initiators or catalysts and polymerization mechanisms. The polymerization processes can be induced by photo-irradiation or by heat, depending upon the design and composition of the planarization materials.

U.S. Pat. No. 6,048,799 to Prybyla et al. describes the use of a planarization material having a viscosity of about 20 centipoises (cP) to 40,000 cP during the planarization step. The materials can be solidified by heat or ultraviolet irradiation. However, this work does not address the effect of the residual solvent in the planarized material, nor does it mention the possible volatile byproducts generated during the solidification process. The presence of the residual solvent in the planarized film, if it is not homogeneously dispersed throughout the film, will cause a density gradient in the planarized material once it is removed from the film.

SUMMARY OF THE INVENTION

The present invention is broadly concerned with novel microelectronic precursors and methods of forming such precursors.

In more detail, the precursors are formed by first applying (such as by spin-coating, spray coating, casting, puddling, fountain coating, etc.) a planarizing layer to a microelectronic substrate having topography features on its surface. This layer will typically be from about 0.1–500 $\mu$m thick (and preferably from about 0.2–200 $\mu$m), with the thickness of the layer preferably being greater than that of the height of the topography features. Examples of typical microelectronic substrates include silicon wafers, compound semiconductor wafers, glass substrates, quartz substrates, polymers, dielectric substrates, metals, alloys, silicon carbide, silicon nitride, sapphire, and ceramics.

The planarizing layer is formed from a material comprising an ingredient selected from the group consisting of photo-curable or thermally curable monomers, oligomers, and mixtures thereof. These planarization materials must be curable (polymerized) through an addition polymerization mechanism that will generate substantially no volatile byproducts (and more preferably will generate no volatile byproducts). The total weight of monomers and/or oligomers in the material should be at least about 10% by weight, and preferably from about 15–100% by weight, based upon the total weight of the planarizing material taken as 100% by weight. Examples of suitable monomers and oligomers include epoxies, novolac epoxies, acrylates, novolac epoxy acrylates, vinyl ethers, novolac epoxy vinyl ethers, and vinyl-containing organic and inorganic monomers/oligomers, and mixtures of the foregoing.

The material preferably further comprises a reactive solvent. As used herein, a reactive solvent is one that reacts with the monomer(s), oligomer(s), or mixtures thereof, so as to form a polymer (by conventional polymerization reactions), with the reactive solvent being substantially consumed during this reaction. Thus, the reactive solvent acts as a co-monomer. When a reactive solvent is utilized, it should be present at levels of from about 1–90% by weight, and preferably from about 10–50% by weight, based upon the total weight of the material taken as 100% by weight. Suitable reactive solvents will necessarily depend upon the monomer or oligomer utilized, however, typical examples include propylene carbonate, glycidyl ethers, vinyl ethers, allyl ethers, acrylates, other mono- or multi-functional reactive solvents, and mixtures of the foregoing.

The material preferably further comprises an ingredient selected from the group consisting of acids, acid generators (e.g., thermal acid generators, photoacid generators), and surfactants. When an acid or acid generator is present, it should be present at levels of from about 0.1–10% by weight, and preferably from about 0.5–3% by weight, based upon the total weight of the material taken as 100% by weight. Examples of suitable acids or acid generators including those selected from the group consisting of triarylsulfonium hexafluorophosphate, triarylsulfonium hexafluoro arsenate, diaryliodonium hexafluorophosphate, diaryliodonium hexafluoro antimonate, diaryliodonium hexafluoro arsenate, triaryl sulphoxonium hexafluorophosphate, and aryloxy sulphoxonium hexafluorophosphate.

When a surfactant is present, it should be non-volatile and should be utilized at levels of from about 0.01–3% by weight, and preferably from about 0.05–0.5% by weight, based upon the total weight of the material taken as 100% by weight. Examples of suitable surfactants include fluorosurfactants and polymeric surfactants.

In a particularly preferred embodiment, the planarization materials comprise very low levels of non-reactive solvents or diluents (e.g., PGME, PGMEA). Thus, the planarizing material comprises less than about 5% by weight, and preferably less than about 2% by weight non-reactive solvents or diluents, based upon the total weight of the planarizing material taken as 100% by weight. Even more preferably, the planarizing material is essentially free of non-reactive solvents or diluents.

Regardless of the ingredients included in the planarizing material, it should have a viscosity of from about 10–50,000 cP, and preferably from about 10–5,000 cP. Thus, the material is capable of filling gaps in a size range of from about 0.1 $\mu$m and greater, and preferably from about 0.2–50,000 $\mu$m.

After the planarizing material is applied, the edge bead is removed if necessary, and the material is contacted with a flat object with said layer for sufficient time and pressure to transfer the flat surface of the object to the planarizing layer. The contacting or pressing step will generally comprise applying pressures of from about 5–200 psi, more preferably from about 10–100 psi, and for a time period of from about 1 second to about 10 minutes, and preferably from about 10–60 seconds.

The contacting step is typically carried out at temperatures of from about 18–400° C., and more preferably from about 18–150° C. However, if thermoplastics are present in the planarizing material, the temperature utilized is highly material-dependent. As far as temperatures are concerned in this situation, it is preferable that the pressing step be carried out at a temperature of from about the $T_g$ of the planarizing material to about 20° C. above the melting point of the planarizing material. Even more preferably, the temperature will be from about 5° C. below to about 10° C. above the melting point of the material.

This process can be carried out in a chamber evacuated to less than about 20 Torr, but ambient conditions are suitable as well. It will be understood that an optical flat or some equivalent means can be used to apply this pressure, and that the chosen pressure-applying means must be selected to adapt to the particular process (e.g., a UV-transparent optical flat is necessary if a UV-curing process is to be utilized).

While the optical flat object and substrate are maintained in contact, the planarizing material is hardened or cured by conventional means. For example, if the composition is photo-curable, then it is subjected to UV light (at a wavelength appropriate for the particular composition) so as to cure the layer. Likewise, if the composition is thermally curable, it can be cured by application of heat (e.g., via a hotplate, via an oven, via IR warming, etc.) followed by cooling to less than its $T_g$, and preferably less than about 50° C. Regardless of the hardening or curing means, the flat object is ultimately separated from the planarizing layer, yielding a precursor that can be subjected to further processing.

DETAILED DESCRIPTION OF THE PREFERRED EMBODIMENTS

Figure 1:
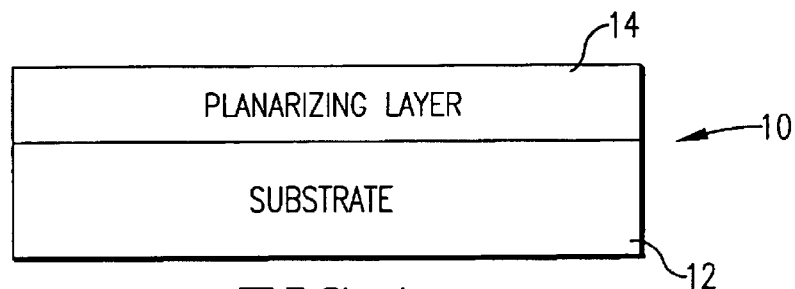
FIG. 1 is a schematic illustration of a circuit precursor structure having a substrate and a planarizing layer on the substrate.

Referring to FIG. 1, an integrated circuit precursor 10 is shown. Precursor 10 comprises a substrate 12 and a cured planarizing layer 14. Although not shown in the figures, those skilled in the art will understand that precursor 10 includes a surface having structures or features thereon. These structures will have varying topography and feature sizes, depending upon the final intended use of the precursor. As used herein, "topography" refers to the height or depth of a structure while "feature size" refers to the width and length of a structure. If the width and length are different, then it is conventional to reference the smaller number as the feature size.

Figure 2:
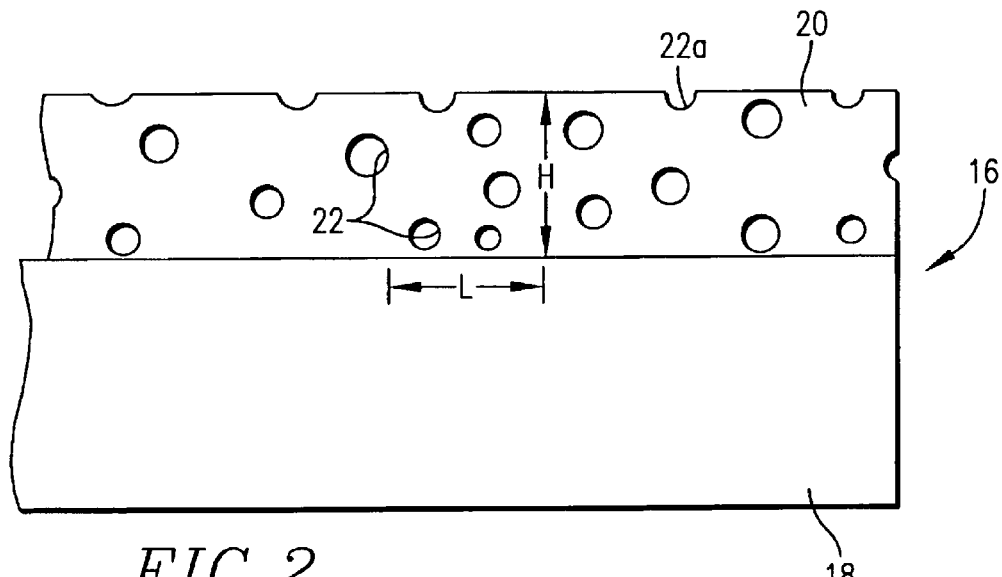
FIG. 2 is a schematic illustration of a cross-sectional view of a prior art precursor structure having a substrate and a planarizing layer on the substrate.

FIG. 2 depicts a cross-sectional view of an integrated circuit precursor 16 which was formed by prior art contact planarization processes as described previously herein. Prior art precursor 16 also includes a substrate 18 and a cured planarizing layer 20. However, when prepared according to prior art contact planarization processes, planarizing layer 20 has undesirable voids 22. Some of these voids are in the form of surface depressions 22a. Regardless of whether these voids 22 are at the surface of layer 20 or within layer 20, they are undesirable because they deteriorate the properties of the film.

Figure 3:
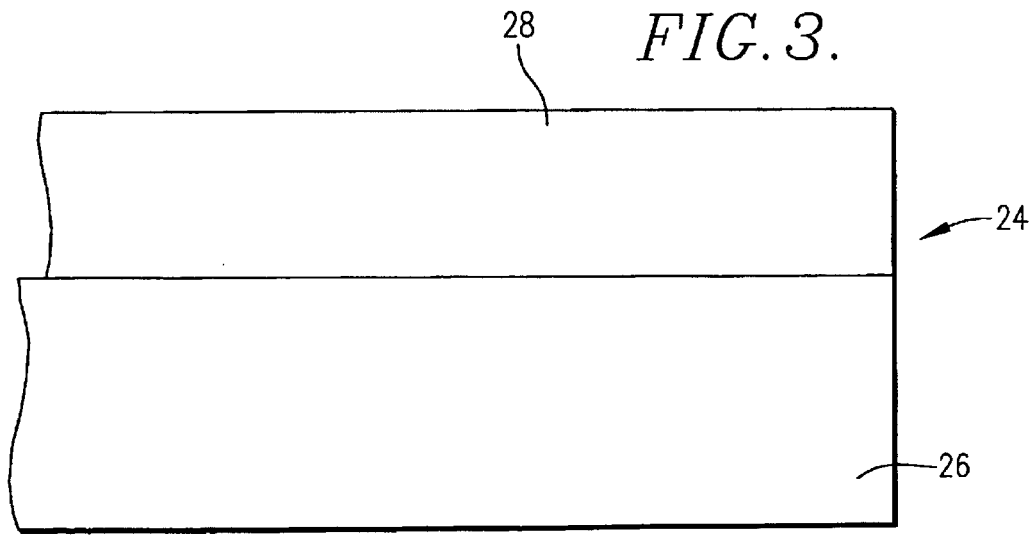
FIG. 3 is a schematic illustration of a cross-sectional view of an inventive precursor structure having a substrate and a planarizing layer on the substrate.

FIG. 3 schematically depicts a cross-sectional view of an integrated circuit precursor 24 formed according to the present invention. Inventive precursor 24 includes a substrate 26 and a cured planarizing layer 28. However, due to the improvements described herein, planarizing layer 28 is essentially free of the voids that were present in prior art precursor 16. Thus, the cured planarizing layers of the precursor structures formed according to the invention will have less than about 1%, preferably less than about 0.5%, and more preferably about 0% voids in the cured layer. As used herein, the term "voids" is defined as areas of the planarizing layer where portions of the layer are missing as shown in FIG. 2. The term "voids" is also intended to include surface depressions. This is to be distinguished from external defects (e.g., foreign particles found in the layer). Those skilled in the art will understand that a "void" is an area that is larger than the natural pores found in the material. The % voids is determined by:

(1) examining five different cross-sectional views of the structure under a scanning electron microscope set at a magnification of 50,000×;

(2) counting the number of voids observed (at this magnification) in about the center of each cross-sectioned piece over a length "L" and a height "H," where "L" is about 10 mm and "H" is about 1 $\mu$m (see FIG. 2);

(3) using the number of voids counted in step (2) to find the % voids in the cured layer for each of the five samples; and (4) determining the average of these five % voids.

EXAMPLES

The following examples set forth preferred methods in accordance with the invention. It is to be understood, however, that these examples are provided by way of illustration and nothing therein should be taken as a limitation upon the overall scope of the invention.

In Examples 1–11, a 6-inch wafer coated with silicon dioxide and having line, trench, and square structures at the surface was used as the substrate (SKW 1—1 Dielectric Oxide CMP Characterization Wafer, purchased from SKW Associates). The widths of the line and trench structures were about 12.5 $\mu$m to 237.5 $\mu$m. The heights of the line structures and the depth of the trench structures were about 0.9–1.0 $\mu$m. There were about 50-$\mu$m and 2000-$\mu$m square holes that are 0.9–1.0 $\mu$m deep on the wafer surface.

Example 1

Novolac Epoxy Planarization Material and Planarization Under Vacuum

A photo-curable planarization material comprising 10 grams of novolac epoxy resin (D.E.R.™ 354 LV, purchased from The Dow Chemical Company) and 0.6 grams of 50% triarylsulfonium hexafluorophosphate (a photoacid generator) solution (purchased from Aldrich) was formulated and mixed thoroughly. The solvent used in the photo acid generator solution was a reactive solvent (i.e., propylene carbonate).

A 24-$\mu$m thick layer of the planarization material was coated onto a 6-inch silicon wafer surface which had been previously treated with an adhesion promoter (APX-K1, obtained from Brewer Science, Inc.) using the vendor's recommended process. A standard edge bead removal process was conducted which removed about 5 mm of edge bead. This wafer was then placed onto a wafer stage in a contact planarization press chamber with the coated surface facing a UV-transparent optical flat object. The press chamber was sealed and evacuated to less than 20 Torr, and the wafer stage was raised to press the wafer against a Teflon® release film which, in turn, pressed against the optical flat surface with a press pressure of 68 psi for 30 seconds. While the planarization material was in contact with the optical flat surface, a continuous UV light (from a Mercury-Xenon lamp) was illuminated through the optical flat surface for 10 seconds to cure the planarization material. Once the planarization material was cured, the press pressure was released. The wafer stage was lowered, the wafer was released from the Teflon® release film, and the chamber was vented. A Dektak 8 (Veeco Metrology Group) was used to characterize the planarized surface roughness and the degree of planarization. A step height of approximately 200 Å of the 1-$\mu$m height of the original substrate structures was found. A degree of planarization of about 98% was achieved. A 100% degree of planarization implies that the original structure step height is totally eliminated. No voids were found in the planarized material. The inventive methods result in a degree of planarization of at least about 90%, preferably at least about 95%, and more preferably at least about 98%.

Example 2

Novolac Epoxy and Glycidyl Ether Planarization Material and Planarization Under Vacuum A photo-curable planarization material formed of 5 grams of novolac epoxy resin (D.E.R.™ 354 LV), 5 grams of n-butyl glycidyl ether (purchased from Aldrich), and 0.6 grams of 50% triarylsulfonium hexafluorophosphate solution was formulated and mixed thoroughly. The solvent used in the photo acid generator solution was propylene carbonate. The material was filtered with a 0.2-$\mu$m filter.

A 1.5-$\mu$m thick layer of the planarization material was coated onto a 6-inch silicon wafer surface that had been previously treated with an adhesion promoter APX-K1 using the vendor's recommended process. A standard edge bead removal process was conducted that removed about 5 mm of edge bead. The wafer was placed onto a wafer stage in a contact planarization press chamber with the coated surface facing a UV-transparent optical flat object. The press chamber was sealed and evacuated to less than 20 Torr, and the wafer stage was raised to press the wafer against a Teflon® release film which then pressed against the optical flat surface with a press pressure of 68 psi for 30 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, the wafer was released from the Teflon® release film, and the chamber was vented. A Dektak 8 was used to characterize the planarized surface roughness and the degree of planarization. A step height of approximately 200 Å of the 1-μm height of the original substrate structures was found. A degree of planarization of about 98% was achieved. No voids were found in the planarized material.

This example was repeated as described except that n-butyl glycidyl ether was replaced by t-butyl glycidyl ether (purchased from Aldrich). A degree of planarization of about 99% was achieved without voids in the planarized material.

Example 3

Novolac Epoxy and Glycidyl Ether Planarization Material and Planarization at Ambient Pressure A photo curable planarization material consisting of 5 grams of novolac epoxy resin (D.E.R.™ 354 LV), 5 grams of t-butyl glycidyl ether, and 0.6 grams of 50% triarylsulfonium hexafluorophosphate solution was formulated and mixed thoroughly. The solvent used in the photo acid generator solution was propylene carbonate. The material was filtered with a 0.2-μm filter.

A 1.7-μm thick layer of the planarization material was coated onto a 6-inch silicon wafer surface that had been previously treated with an adhesion promoter (APX-K1) using the vendor's recommended process. A standard edge bead removal process was conducted that removed about 5 mm of edge bead. The wafer was placed onto a wafer stage in a contact planarization press chamber with the coated surface facing a UV-transparent optical flat object. The press chamber was sealed, and the wafer stage was raised to press the wafer against a Teflon® release film which, in turn, pressed against the optical flat surface with a press pressure of 68 psi for 30 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, the wafer was released from the Teflon® release film. A Dektak 8 was used to characterize the planarized surface roughness and the degree of planarization. A step height of approximately 200 Å of the 1-μm height of the original substrate structures was found. A degree of planarization of about 98% was achieved. No voids were found in the planarized material.

Example 4

Novolac Epoxy and Vinyl Ether Planarization Material and Planarization Under Vacuum A photo curable planarization material comprising 5 grams of novolac epoxy resin (D.E.R.™ 354 LV), 5 grams of 1,4-cyclohexane dimethanol divinyl ether (purchased from Aldrich), and 0.6 grams of 50% triarylsulfonium hexafluorophosphate solution was formulated and mixed thoroughly. The solvent used in the photoacid generator solution was a propylene carbonate. The material was filtered with a 0.2-μm filter.

A 2.4-μm thick layer of the planarization material was coated onto a 6-inch silicon wafer surface which had been previously treated with an adhesion promoter (APX-K1) using the vendor's recommended process. A standard edge bead removal process was conducted which removed about 5 mm of edge bead. This wafer was placed onto a wafer stage in a contact planarization press chamber with the coated surface facing a UV-transparent optical flat object. The press chamber was sealed and evacuated to less than 20 Torr, and the wafer stage was raised to press the wafer against a Teflon® release film which pressed against the optical flat surface with a press pressure of 68 psi for 30 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, the wafer was released from the Teflon® release film, and the chamber was vented. A Dektak 8 was used to characterize the planarized surface roughness and the degree of planarization. A step height of approximately 400 Å of the 1-μm height of the original substrate structures was found. A degree of planarization of about 96% was achieved. No voids were found in the planarized material.

Example 5

Vinyl Ether Planarization Material and Planarization at Ambient Pressure with Pulsing UV Exposure A photo curable planarization material comprising 10 grams of bis[4-(vinyloxy)butyl]isophthalate (VEctomer® 4010 vinyl ether marketed by Morflex, Inc., purchased from Aldrich) and 0.6 grams of 50% triarylsulfonium hexafluorophosphate solution was formulated and mixed thoroughly. The solvent used in the photoacid generator solution was propylene carbonate.

A 4.2-μm thick layer of the planarization material was coated onto a 6-inch silicon wafer surface that had been previously treated with an adhesion promoter (APX-K1) using the vendor's recommended process. The wafer was placed onto a wafer stage in a contact planarization press chamber with the coated surface facing a UV-transparent optical flat object. The press chamber was sealed, and the wafer stage was raised to press the wafer against a Teflon® release film which, in turn, pressed against the optical flat surface with a press pressure of 68 psi for 30 seconds. While the planarization material was in contact with the optical flat surface, a continuous UV light was illuminated through the optical flat surface for 10 seconds, the UV light was then turned off for 20 seconds, and a second exposure of 10 seconds was carried out. The total UV light exposure time was 20 seconds. Once the planarization material was cured, the press pressure was released. The wafer stage was lowered, and the wafer was released from the Teflon® release film. A Dektak 8 was used to characterize the planarized surface roughness and the degree of planarization. A step height of approximately 100 Å of the 1-μm height of the original substrate structures was found. A degree of planarization of about 99% was achieved. No voids were found in the planarized material.

Example 6

Novolac Epoxy and Vinyl Ether Planarization Material and Planarization at Ambient Pressure A photo curable planarization material including 10 grams of novolac epoxy resin D.E.N.™ 431 (purchased from The Dow Chemical Company), 10 grams of bis[4-(vinyloxy) butyl] isophthalate and 0.6 grams of 50% triarylsulfonium hexafluorophosphate solution was formulated and mixed thoroughly. The solvent used in the photoacid generator solution was propylene carbonate.

A 12.5-μm thick layer of the planarization material was coated onto a 6-inch silicon wafer surface that had been previously treated with an adhesion promoter (APX-K1) using the vendor's recommended process. The wafer was placed onto a wafer stage in a contact planarization press chamber with the coated surface facing a UV-transparent optical flat object. The press chamber was sealed, and the wafer stage was raised to press the wafer against a Teflon® release film which pressed against the optical flat surface with a press pressure of 68 psi for 30 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, the wafer was released from the Teflon® release film. A Dektak 8 was used to characterize the planarized surface roughness and the degree of planarization. A step height of approximately 100 Å of the 1-$\mu$m height of the original substrate structures was found. A degree of planarization of about 99% was achieved. There were no voids found in the planarized material.

This example was repeated as described except that 0.08 gram of fluorosurfactant (FC-4430, obtained from 3M) was added to the planarization material, and the UV exposure parameters described in Example 5 were utilized. A comparable degree of planarization was obtained without voids in the planarized material.

Example 7

Epoxy Novolac Diacrylate Planarization Material and Planarization at Ambient Pressure A photo curable planarization material consisting of 10 grams of bisphenol-A epoxy diacrylate (EBECRYL® 3200; an aliphatic/aromatic epoxy acrylate blend, purchased from UCB Chemicals), and 0.6 grams of Darocur® 1173 (a photo-initiator, obtained from Ciba) was formulated and mixed thoroughly.

A 17.5-$\mu$m thick layer of the planarization material was coated onto a 6-inch silicon wafer surface that had been previously treated with an adhesion promoter (APX-K1) using the vendor's recommended process. The wafer was placed onto a wafer stage in a contact planarization press chamber with the coated surface facing a UV-transparent optical flat object. The press chamber was sealed, and the wafer stage was raised to press the wafer against a Teflon® release film which was pressed against the optical flat surface with a press pressure of 68 psi for 30 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, and the wafer was released from the Teflon® release film. A Dektak 8 was used to characterize the planarized surface roughness and the degree of planarization. A step height of approximately 200 Å of the 1-$\mu$m height of the original substrate structures was found. A degree of planarization of about 98% was achieved. No voids were found in the planarized material.

Example 8

Epoxy Novolac Acrylate and Acrylate Diluents Planarization Material and Planarization at Ambient Pressure A photo curable planarization material comprising 10 grams of EBECRYL® 3603 (obtained from UCB Chemicals, contains novolac epoxy acrylate diluted with 20% tripropylene glycol diacrylate), and 0.6 grams of EBECRYL® BPO (a photo-initiator, obtained from UCB Chemicals) was formulated and mixed thoroughly.

A 17-$\mu$m thick layer of the planarization material was coated onto a 6-inch silicon wafer surface that had been previously treated with an adhesion promoter (APX-K1) using the vendor's recommended process. The wafer was placed onto a wafer stage in a contact planarization press chamber with the coated surface facing a UV-transparent optical flat object. The press chamber was sealed, and the wafer stage was raised to press the wafer against a Teflon® release film which, in turn, pressed against the optical flat surface with a press pressure of 68 psi for 30 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, and the wafer was released from the Teflon® release film. A Dektak 8 was used to characterize the planarized surface roughness and the degree of planarization. A step height of approximately 100 Å of the 1-$\mu$m height of the original substrate structures was found. A degree of planarization of about 99% was achieved. No voids were found in the planarized material.

Example 9

Novolac Epoxy and Allyl Glycidyl Ether Planarization Material and Planarization Under Vacuum A photo-curable planarization material consisting of 5 grams of novolac epoxy resin D.E.N.™ 431 (purchased from The Dow Chemical Company), 5 grams of allyl glycidyl ether (purchased from Aldrich), and 0.6 grams of 50% triarylsulfonium hexafluorophosphate solution was formulated and mixed thoroughly. The solvent used in the photoacid generator solution was propylene carbonate. The material was filtered with 0.2-$\mu$m filter.

A 1.8-$\mu$m thick layer of the planarization material was coated onto a 6-inch silicon wafer surface that had been previously treated with an adhesion promoter (APX-K1) using the vendor's recommended process. A standard edge bead removal process was conducted that removed about 5 mm of edge bead. The wafer was placed onto a wafer stage in a contact planarization press chamber with the coated surface facing a UV-transparent optical flat object. The press chamber was sealed and evacuated to less than 20 Torr, and the wafer stage was raised to press the wafer against a Teflon® release film which pressed against the optical flat surface with a press pressure of 68 psi for 30 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, the wafer was released from the Teflon® release film, and the chamber was vented. A Dektak 8 was used to characterize the planarized surface roughness and the degree of planarization. A step height of approximately 100 Å of the 1-$\mu$m height of the original substrate structures was found. A degree of planarization of about 99% was achieved. No voids were found in the planarized material.

Example 10

Novolac Epoxy and Allyl Glycidyl Ether Planarization Material and Planarization Under Ambient Pressure with Pulsing UV Exposure A photo-curable planarization material consisting of 10 grams of novolac epoxy resin D.E.N.™ 431, 10 grams of allyl glycidyl ether, 0.09 gram of fluorosurfactant (FC-4430), and 0.6 grams of 50% triarylsulfonium hexafluorophosphate solution was formulated and mixed thoroughly. The solvent used in the photoacid generator solution was propylene carbonate.

A 1.8-μm thick layer of the planarization material was coated onto a 6-inch silicon wafer surface that had been previously treated with an adhesion promoter (APX-K1) using the vendor's recommended process. The wafer was placed onto a wafer stage in a contact planarization press chamber with the coated surface facing a UV-transparent optical flat object. The press chamber was sealed, and the wafer stage was raised to press the wafer against a Teflon® release film which then pressed against the optical flat surface with a press pressure of 68 psi for 30 seconds. While the planarization material was in contact with the optical flat surface, a continuous UV light was illuminated through the optical flat surface for 10 seconds, the UV light was then turned off for 20 seconds, and a second exposure of 10 seconds was carried out. The total UV light exposure time was 20 seconds. Once the planarization material was cured, the press pressure was released. The wafer stage was lowered, and the wafer was released from the Teflon® release film. A Dektak 8 was used to characterize the planarized surface roughness and the degree of planarization. A step height of approximately 150 Å of the 1-μm height of the original substrate structures was found. A degree of planarization of about 98% was achieved. No voids were found in the planarized material.

Example 11

Novolac Epoxy and Allyl Glycidyl Ether Planarization Material and Planarization Under Ambient Pressure with Short Press Time A photo-curable planarization material consisting of 5 grams of novolac epoxy resin D.E.N.™ 431, 5 grams of allyl glycidyl ether, and 0.6 grams of 50% triarylsulfonium hexafluorophosphate solution was formulated and mixed thoroughly. The solvent used in the photo acid generator solution was a propylene carbonate.

A 1.8-μm thick layer of the planarization material was coated onto a 6-inch silicon wafer surface that had been previously treated with an adhesion promoter (APX-K1) using the vendor's recommended process. The wafer was placed onto a wafer stage in a contact planarization press chamber with the coated surface facing a UV-transparent optical flat object. The press chamber was sealed, and the wafer stage was raised to press the wafer against a Teflon® release film which pressed against the optical flat surface with a press pressure of 68 psi for 10 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, the wafer was released from the Teflon® release film. A Dektak 8 was used to characterize the planarized surface roughness and the degree of planarization. A step height of approximately 100 Å of the 1-μm height of the original substrate structures was found. A degree of planarization of about 99% was achieved. There were no voids found in the planarized material.

Example 12

Novolac Epoxy and Glycidyl Ether Planarization Materials Planarization Under Ambient Pressure Using Sub-micron Via Holes Substrate A silicon dioxide coated wafer with sub-micron via holes was used as the substrate. The via hole diameter ranged from 0.2-μm to 1.0-μm. The depth of the via holes was about 1.0-μm.

A photo-curable planarization material comprising 5 grams of novolac epoxy resin D.E.R.™ 354 LV, 5 grams of t-butyl glycidyl ether, and 0.6 grams of 50% triarylsulfonium hexafluorophosphate solution was formulated and mixed thoroughly. The solvent used in the photoacid generator solution was propylene carbonate.

A layer of planarization material about 1.7 μm thick was coated onto the via hole wafer surface that had previously been treated with an adhesion promoter (APX-K1) using the vendor's recommended process. The wafer was placed onto a wafer stage in a contact planarization press chamber with the coated surface facing a UV-transparent optical flat object. The press chamber was sealed, and the wafer stage was raised to press the wafer against a Teflon® release film which then pressed against the optical flat surface with a press pressure of 68 psi for 30 seconds. While the planarization material was in contact with the optical flat surface, a continuous UV light was illuminated through the optical flat surface for 10 seconds to cure the planarization material. Once the planarization material was cured, the press pressure was released. The wafer stage was lowered, and the wafer was released from the Teflon® release film. A Dektak 8 was used to characterize the planarized surface roughness and the degree of planarization. A step height of approximately 100 Å of the 1-μm height of the original substrate structures was found. A degree of planarization of greater than 99% was achieved. There were no voids found in the planarized material.

We claim:

1. A method of forming a microelectronic precursor, said method comprising the steps of:
   providing a substrate having a surface and including a plurality of topography features on said surface;
   forming a planarizing layer on said surface, wherein said planarizing layer comprises:
      a monomer, an oligomer, or a mixture of a monomer and an oligomer; and
      a reactive solvent;
   contacting the planarizing layer with a flat surface of an object for sufficient time and pressure to transfer the flatness of the flat surface to the planarizing layer.

2. The method of claim 1, said planarizing layer further comprising an ingredient selected from the group consisting of acids, acid generators, surfactants, and photo-initiators.

3. The method of claim 2, wherein said ingredient is a photoacid generator.

4. The method of claim 1, wherein said planarizing layer consists essentially of:
   a monomer, an oligomer, or a mixture of a monomer and an oligomer;
   a reactive solvent; and
   an acid or an acid generator.

5. The method of claim 1, wherein said monomer or oligomer is selected from the group consisting of epoxies, novolac epoxies, acrylates, novolac epoxy acrylates, vinyl ethers, novolac epoxy vinyl ethers, and monomers and oligomers comprising vinyl groups, and mixtures of the foregoing.

6. The method of claim 1, wherein said reactive solvent is propylene carbonate, glycidyl ethers, vinyl ethers, allyl ethers, acrylates, and mixtures of the foregoing.

7. The method of claim 1, wherein said planarizing layer comprises less than about 5% by weight of non-reactive solvent, based upon the total weight of the planarizing layer taken as 100% by weight.

8. The method of claim 1, further including the step of substantially curing said planarizing layer.

9. The method of claim 8, wherein said curing step comprises subjecting said planarizing layer to UV light for sufficient time to substantially cure said composition.

10. The method of claim 8, wherein said curing step causes said monomer, oligomer, or mixture of a monomer and an oligomer to react with said reactive solvent so as to substantially consume said reactive solvent.

11. The method of claim 8, wherein said microelectronic precursor resulting from said curing step comprises a cured planarizing layer, and said cured planarizing layer comprises less than about 1% voids.

12. The method of claim 1, wherein said providing, forming, and contacting steps are carried out under ambient pressures.

13. The method of claim 1, wherein said providing, forming, and contacting steps are carried out under vacuum.

14. The method of claim 1, wherein said contacting step is carried out with a pressure of from about 5–200 psi.

15. The method of claim 1, wherein said contacting step is carried out at a temperature of from about 18–400° C.

16. The method of claim 1, wherein said contacting step is carried out for a time period of from about 1 second to about 10 minutes.

17. A precursor structure formed by:
   providing a substrate having a surface and including a plurality of topography features on said surface;
   forming a planarizing layer on said surface, wherein said planarizing layer comprises:
      a monomer, an oligomer, or a mixture of a monomer and an oligomer; and
      a reactive solvent;
   contacting the planarizing layer with a flat surface of an object for sufficient time and pressure to transfer the flatness of the flat surface to the planarizing layer.

18. The precursor structure of claim 17, said planarizing layer further comprising an ingredient selected from the group consisting of acids, acid generators, surfactants, and photo-initiators.

19. The precursor structure of claim 17, wherein said planarizing layer consists essentially of:
   a monomer, an oligomer, or a mixture of monomers and oligomers;
   a reactive solvent; and
   an ingredient selected from the group consisting of an acid, an acid generator, and a photo-initiator.

20. The precursor structure of claim 17, wherein said planarizing layer comprises less than about 5% by weight of non-reactive solvent, based upon the total weight of the planarizing layer taken as 100% by weight.

21. The precursor structure of claim 17, further including the step of substantially curing said planarizing layer.

22. The precursor structure of claim 21, wherein said microelectronic precursor resulting from said curing step comprises a cured planarizing layer, and said cured planarizing layer comprises less than about 1% voids.

23. The precursor structure of claim 17, wherein said providing, forming, and contacting steps are carried out under ambient pressures.

24. The precursor structure of claim 17, wherein said providing, forming, and contacting steps are carried out under vacuum.

25. A method of forming a microelectronic precursor, said method comprising the steps of:
   providing a substrate having a surface and including a plurality of topography features on said surface;
   forming a planarizing layer on said surface;
   contacting the planarizing layer with a flat surface of an object for sufficient time and pressure to transfer the flatness of the flat surface to the planarizing layer;
   curing said planarizing layer after or during said contacting step, said cured planarizing layer comprising less than about 1% voids.

26. The method of claim 25, wherein said providing, forming, and contacting steps are carried out under ambient pressures.

27. The method of claim 25, wherein said providing, forming, and contacting steps are carried out under vacuum.

28. The method of claim 25, wherein said contacting step is carried out at a temperature of from about 18–400° C.

29. The method of claim 25, wherein said contacting step is carried out for a time period of from about 1 second to about 10 minutes.

30. The combination of:
   a microelectronic substrate having a surface and a plurality of topography features on said surface; and
   a cured planarizing layer on said surface, said cured planarizing layer having a substantially planar surface remote from said substrate surface, and said cured planarizing layer comprising less than about 1% voids.

31. The combination of claim 30, wherein said substrate is selected from the group consisting of silicon wafers, compound semiconductor wafers, glass substrates, quartz substrates, organic polymers, dielectric substrates, metals, alloys, silicon carbide, silicon nitride, sapphire, and ceramics.

* * * * *